US012727189B2

(12) United States Patent
Chang et al.

(10) Patent No.: US 12,727,189 B2
(45) Date of Patent: Sep. 1, 2026

(54) METHOD FOR FABRICATING HIGH ELECTRON MOBILITY TRANSISTOR

(71) Applicant: UNITED MICROELECTRONICS CORP., Hsin-Chu City (TW)

(72) Inventors: Chih-Wei Chang, Tainan City (TW); Yao-Hsien Chung, Kaohsiung City (TW); Shih-Wei Su, Tainan City (TW); Hao-Hsuan Chang, Kaohsiung City (TW); Ting-An Chien, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 624 days.

(21) Appl. No.: 18/129,095

(22) Filed: Mar. 31, 2023

(65) Prior Publication Data

US 2023/0238455 A1 Jul. 27, 2023

Related U.S. Application Data

(63) Continuation of application No. 17/179,322, filed on Feb. 18, 2021, now Pat. No. 11,688,802.

(51) Int. Cl.

*H10D 30/47* (2025.01)
*H10D 30/01* (2025.01)
*H10D 62/85* (2025.01)

(52) U.S. Cl.

CPC ......... *H10D 30/475* (2025.01); *H10D 30/015* (2025.01); *H10D 62/8503* (2025.01)

(58) Field of Classification Search

CPC ........... H01L 21/0214; H01L 21/02326; H01L 21/02332; H10D 30/015; H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478

See application file for complete search history.

(56) References Cited

U.S. PATENT DOCUMENTS 6,087,229 A * 7/2000 Aronowitz ........ H01L 21/02247 438/786
7,985,986 B2 7/2011 Heikman (Continued)

OTHER PUBLICATIONS

"Quality of the Oxidation Interface of AlGaN in Enhancement-Mode AlGaN/GaN High-Electron Mobility Transistors" IEEE Transactions on Electron Devices, vol. 59, No. 12, Dec. 2012, by Hsien-Chin Chiu (Year: 2012).*

*Primary Examiner* — Eric A. Ward
(74) *Attorney, Agent, or Firm* — Winston Hsu

(57) ABSTRACT

A method for forming a high electron mobility transistor is disclosed. A substrate is provided. A channel layer is formed on the substrate. An electron supply layer is formed on the channel layer. A dielectric passivation layer is formed on the electron supply layer. A gate recess is formed into the dielectric passivation layer and the electron supply layer. A surface modification layer is conformally deposited on an interior surface of the gate recess. The surface modification layer is first subjected to the nitride treatment and is then subjected to the oxidation treatment. A P-type GaN layer is formed in the gate recess and on the surface modification layer.

12 Claims, 3 Drawing Sheets

(56) References Cited

U.S. PATENT DOCUMENTS 9,755,040 B2 9/2017 Aoki
9,818,840 B2 11/2017 Kikkawa
10,068,976 B2 9/2018 Yeh
10,680,094 B2 6/2020 Banerjee
11,688,802 B2 * 6/2023 Chang ................ H10D 62/8503 257/76
2006/0172473 A1 * 8/2006 Cheng ............... H01L 21/02329 438/786
2006/0220060 A1 10/2006 Nakata
2008/0258243 A1 10/2008 Kuroda
2010/0025730 A1 2/2010 Heikman
2010/0078738 A1 * 4/2010 Chambers ............ H10D 64/693 257/E21.267
2010/0102357 A1 4/2010 Sato
2011/0227093 A1 9/2011 Hikita
2012/0091522 A1 4/2012 Ozaki
2012/0205662 A1 8/2012 Nakamura
2012/0329285 A1 * 12/2012 Wang ................ H01L 21/02337 438/762
2014/0113443 A1 4/2014 Won
2016/0196971 A1 * 7/2016 Hsu ...................... H10D 30/021 438/585
2017/0104093 A1 4/2017 Takado
2017/0207319 A1 7/2017 Kikkawa
2018/0350945 A1 12/2018 Hsu
2019/0280095 A1 9/2019 Chen
2020/0044067 A1 * 2/2020 Banerjee .............. H10D 30/015
2020/0328298 A1 10/2020 Yang

* cited by examiner

METHOD FOR FABRICATING HIGH ELECTRON MOBILITY TRANSISTOR

CROSS REFERENCE TO RELATED APPLICATIONS

This application is a continuation application of U.S. application Ser. No. 17/179,322, filed on Feb. 18, 2021. The content of the application is incorporated herein by reference.

BACKGROUND OF THE INVENTION

1. Field of the Invention

The present invention relates to the field of compound semiconductor technology, and more particularly to a gallium nitride (GaN) high electron mobility transistor (HEMT) and a method of fabricating the same.

2. Description of the Prior Art

Gallium nitride high electron mobility transistors (GaN HEMT) are often used in high frequency, high power amplifier components with high breakdown voltage, high electron mobility and saturated carrier velocity, and high temperature operation.

According to the prior art, forming a normally-off GaN HEMT generally requires directly etching a P-type GaN layer, or using a re-growth method to grow an AlGaN layer on a P-type GaN layer. However, in the above method, directly etching the P-type GaN layer causes etching damage of the underlying AlGaN layer, and the re-growth process step is too complex, the productivity is low, and the cost is too high. Further, when forming the recessed gate of the normally-off GaN HEMT, the surface roughness at the interface between the AlGaN layer and the P-type GaN layer may adversely affect the device performance.

SUMMARY OF THE INVENTION

The present disclosure provides an improved gallium nitride high electron mobility transistor and a method of fabricating the same that can solve the deficiencies and shortcomings of the prior art as described above.

One aspect of the invention provides a method for forming a high electron mobility transistor. A substrate is provided. A channel layer is formed on the substrate. An electron supply layer is formed on the channel layer. A dielectric passivation layer is formed on the electron supply layer. A gate recess is formed into the dielectric passivation layer and the electron supply layer. A surface modification layer is conformally deposited on an interior surface of the gate recess. The surface modification layer is subjected to an oxidation treatment or a nitridation treatment, wherein the surface modification layer is first subjected to the nitride treatment and is then subjected to the oxidation treatment. A P-type GaN layer is formed in the gate recess and on the surface modification layer.

According to some embodiments, the surface modification layer is an amorphous silicon layer.

According to some embodiments, the amorphous silicon layer has a thickness of equal to or less than 10 angstroms.

According to some embodiments, the gate recess does not penetrate through the electron supply layer.

According to some embodiments, the dielectric passivation layer comprises oxide or aluminum nitride.

According to some embodiments, the dielectric passivation layer is thicker than the surface modification layer.

According to some embodiments, the dielectric passivation layer has a thickness of about 20 nanometers.

According to some embodiments, before forming the channel layer on the substrate, the method further comprises the step of forming a buffer layer on the substrate.

According to some embodiments, the buffer layer comprises AlN or AlGaN.

According to some embodiments, the substrate is a silicon substrate.

According to some embodiments, the channel layer comprises intrinsic GaN.

According to some embodiments, the electron supply layer comprises AlGaN.

According to some embodiments, after forming the P-type GaN layer in the gate recess, the method further comprises the steps of forming a gate electrode on the P-type GaN layer; and forming a source electrode in a source region and a drain electrode in a drain region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic cross-sectional views showing the fabrication of a high electron mobility transistor according to an embodiment of the invention.

DETAILED DESCRIPTION

Figure 3:
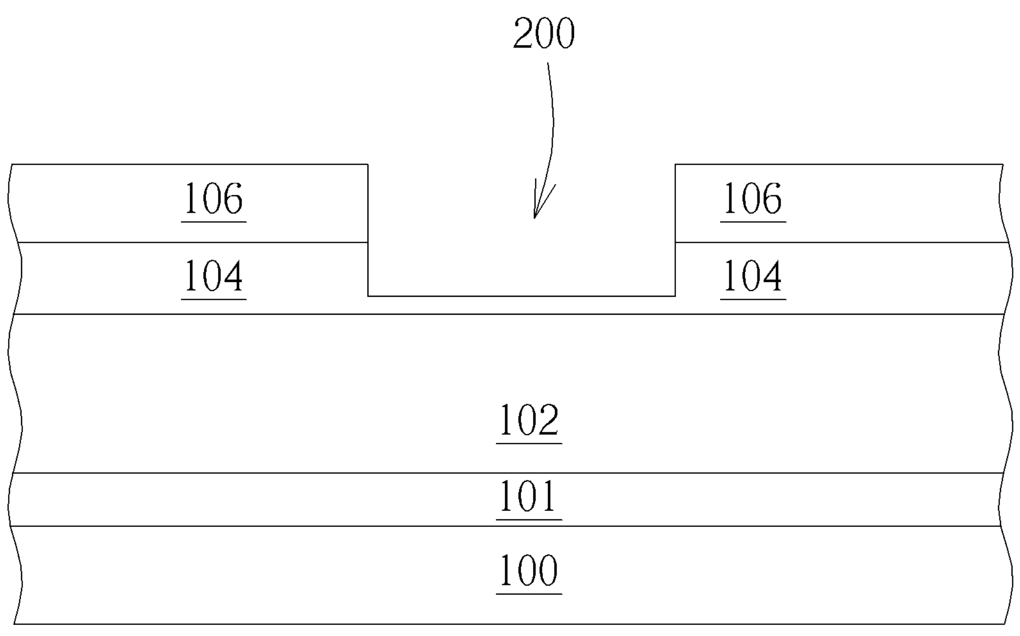

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figures 1, 2:
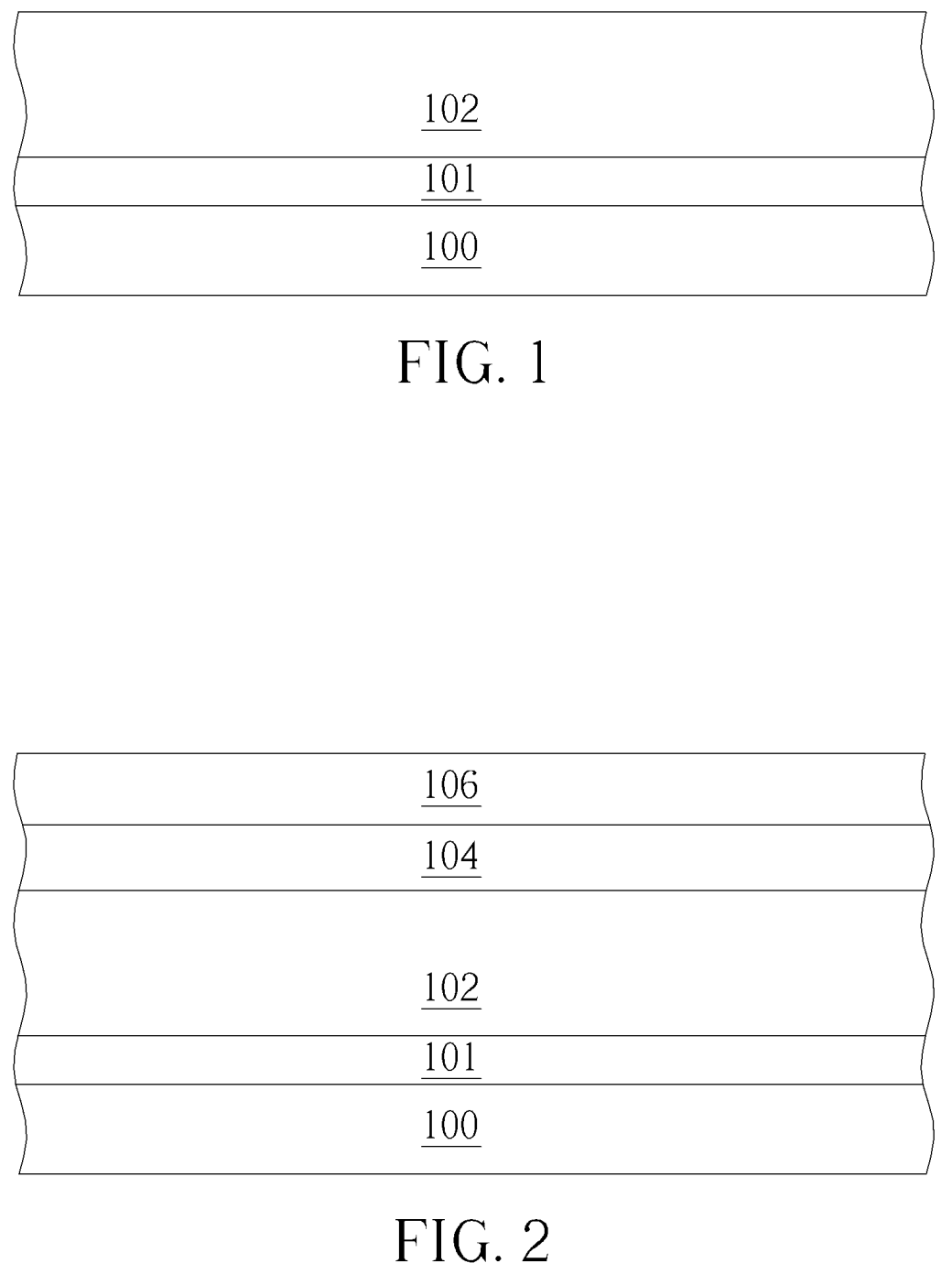

FIG. 1 to FIG. 6 are schematic cross-sectional views showing the fabrication of a high electron mobility transistor according to an embodiment of the invention. As shown in FIG. 1, a substrate 100 is provided. For example, the substrate 100 may be a silicon substrate, but is not limited thereto. A channel layer 102 may be grown on the substrate 100. According to an embodiment, for example, the channel layer 102 may comprise intrinsic GaN. Optionally, before the formation of the channel layer 102, a buffer layer 101 may be formed on the substrate 100. For example, the buffer layer 101 may comprise AlN or AlGaN, but is not limited thereto.

As shown in FIG. 2, an electron supply layer 104 is then formed on the channel layer 102. According to an embodiment, for example, the electron supply layer 104 may comprise AlGaN, but is not limited thereto. Subsequently, a dielectric passivation layer 106 is formed on the electron supply layer 104. According to an embodiment, for example, the dielectric passivation layer 106 may comprise oxide or aluminum nitride, but is not limited thereto. According to an embodiment, for example, the dielectric passivation layer 106 may have a thickness of about 20 nanometers.

As shown in FIG. 3, after forming the dielectric passivation layer 106, a lithographic process and an etching process are performed to form a gate recess 200 into the dielectric passivation layer 106 and the electron supply layer 104. According to an embodiment, the gate recess 200 penetrates through the dielectric passivation layer 106, but does not penetrate through the electron supply layer 104.

Figure 4:
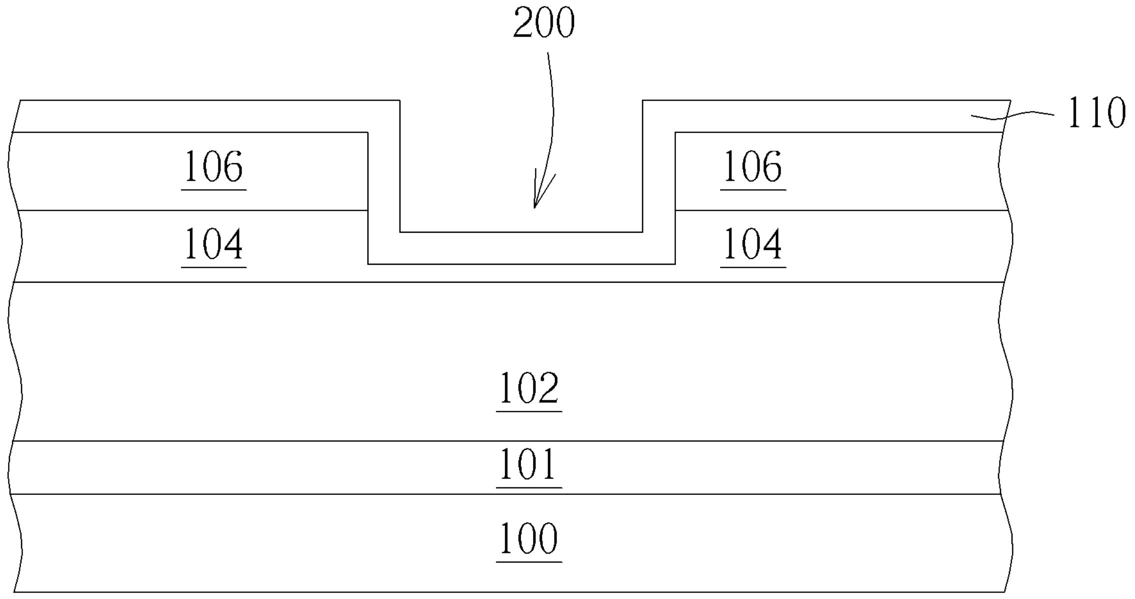

As shown in FIG. 4, subsequently, a surface modification layer 110 is conformally deposited on an interior surface of the gate recess 200 and on the top surface of the dielectric passivation layer 106. According to an embodiment, for example, the surface modification layer 110 is an amorphous silicon layer. Preferably, the amorphous silicon layer 110 may have a thickness of equal to or less than 10 angstroms. According to an embodiment, the dielectric passivation layer 106 is thicker than the surface modification layer 110.

Figure 5:
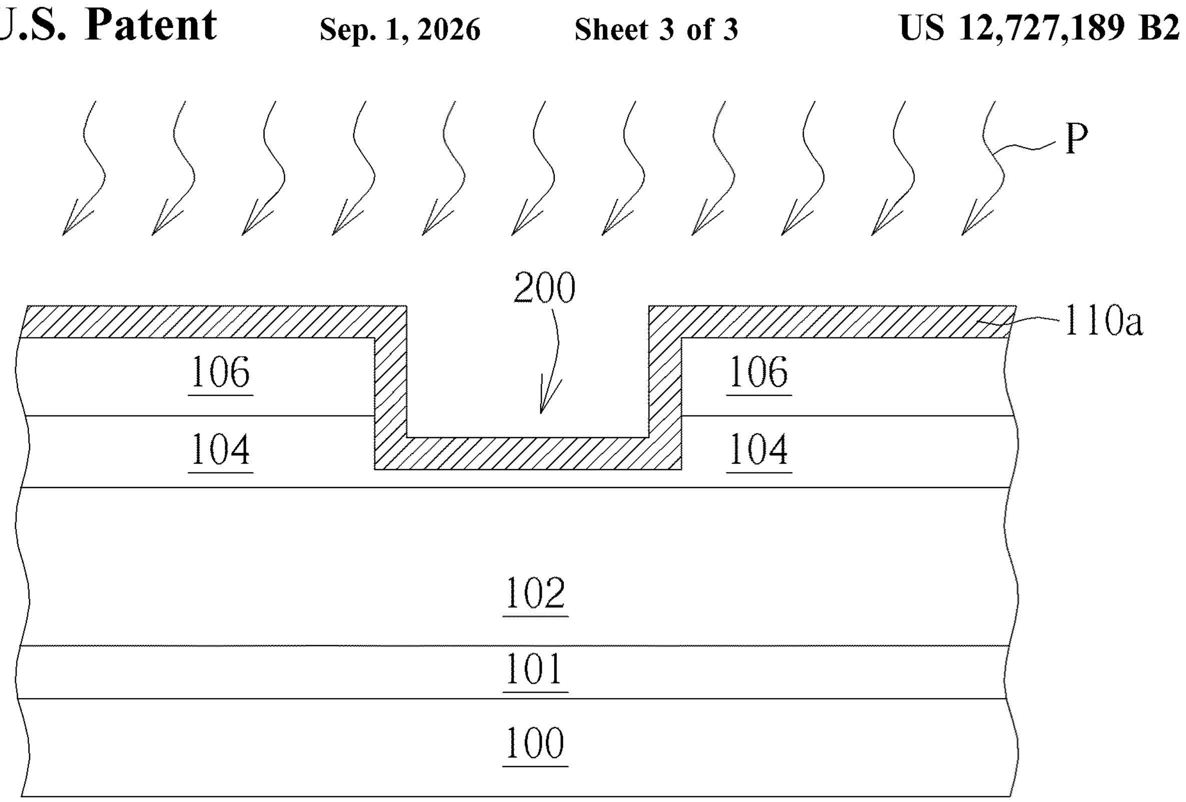

As shown in FIG. 5, the surface modification layer 110 is then subjected to a treatment P such as an oxidation treatment, thereby transforming an entire thickness of the amorphous silicon layer is into a treated surface modification layer **110*a* such as a silicon oxide layer. In some embodiments, the treatment P may be a nitridation treatment and the entire thickness of the amorphous silicon layer 110 is transformed into a silicon nitride layer. In some embodiments, the surface modification layer 110 may be subjected to the nitride treatment and is then subjected to the oxidation treatment. In some embodiments, the surface modification layer 110** may be subjected to the nitride treatment and is then subjected to the oxidation treatment. According to some embodiments, the treatment P may comprise anneal processes, plasma treatment, ion implantation or wet clean, but is not limited thereto.

It is advantageous to use the present invention because the surface modification layer 110 after subjected to the treatment P can reduce the surface roughness on the interior surface of the gate recess 200 and the interface defects can be significantly decreased. The surface modification layer 110 also prevents the GaN/AlGaN from oxidation.

Figure 6:
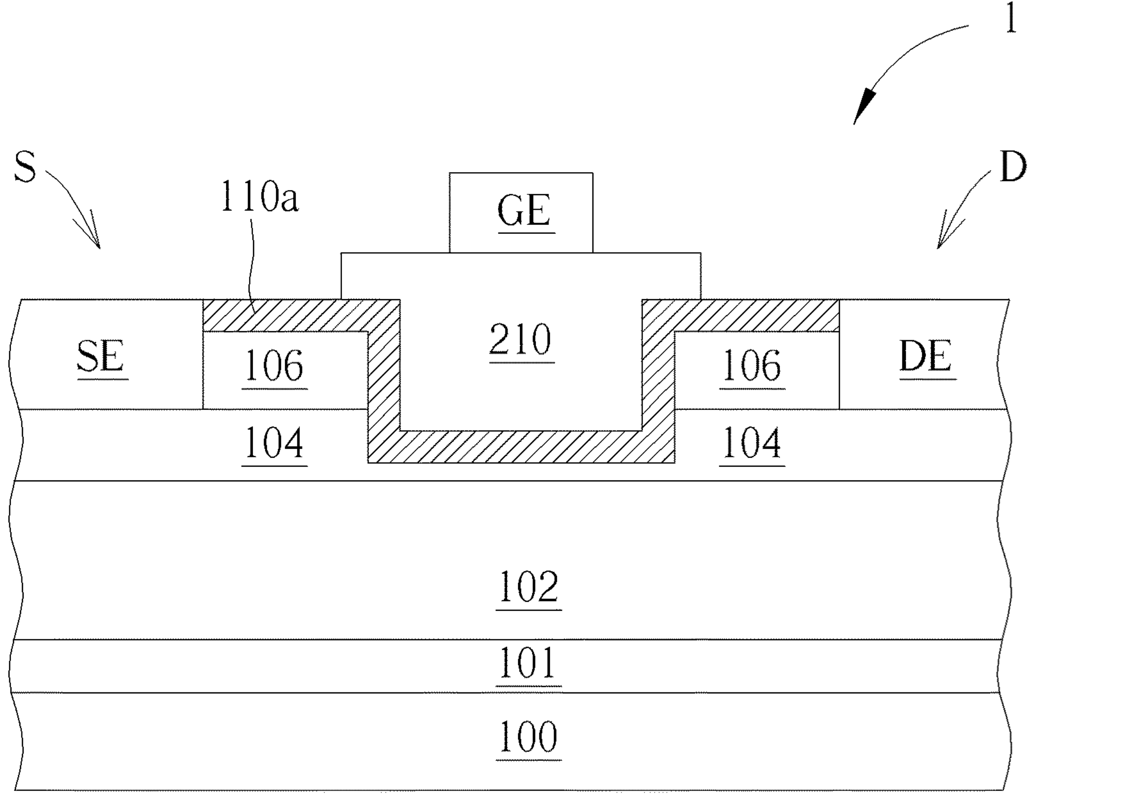

As shown in FIG. 6, after the treatment P is completed, a P-type GaN layer 210 is formed in the gate recess 200 and on the treated surface modification layer **110*a*. After the formation of the P-type GaN layer 210 in the gate recess 200, a gate electrode GE is formed on the P-type GaN layer 210. Thereafter, a source electrode SE may be formed in a source region S and a drain electrode DE may be formed in a drain region D, thereby forming the high electron mobility transistor 1**. According to an embodiment, for example, the gate electrode GE, the source electrode SE, and the drain electrode DE may comprise a metal, but is not limited thereto.

Structurally, as shown in FIG. 6, the high electron mobility transistor 1 includes a substrate 100, a channel layer 102 on the substrate 100, an electron supply layer 104 on the channel layer 102, a dielectric passivation layer 106 on the electron supply layer 104, a gate recess 200 in the dielectric passivation layer 106 and the electron supply layer 104, a surface modification layer **110*a* on an interior surface of the gate recess 200, and a P-type GaN layer 210 in the gate recess 200 and on the surface modification layer 110*a*. According to an embodiment, after subjecting to the treatment P such as oxidation or nitridation, the surface modification layer 110*a* may have a gradient silicon concentration. That is, the silicon concentration of the surface modification layer 110*a* is not a constant across the entire thickness of the surface modification layer 110*a***.

According to an embodiment, the surface modification layer **110*a* is a silicon oxide layer or a silicon nitride layer. According to an embodiment, the gate recess 200 does not penetrate through the electron supply layer 104. According to an embodiment, the high electron mobility transistor 1 further comprises a gate electrode GE on the P-type GaN layer 210**, a source electrode SE in a source region S and a drain electrode DE in a drain region D.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a high electron mobility transistor, comprising:

providing a substrate;

forming a channel layer on the substrate;

forming an electron supply layer on the channel layer;

forming a dielectric passivation layer on the electron supply layer;

forming a gate recess into the dielectric passivation layer and the electron supply layer;

conformally depositing a single-layered surface modification layer on an interior surface of the gate recess, wherein the single-layered surface modification layer is in direct contact with a top surface of the dielectric passivation layer, wherein the single-layered surface modification layer is an amorphous silicon layer;

subjecting the single-layered surface modification layer to an oxidation treatment or a nitridation treatment, wherein the single-layered surface modification layer is first subjected to the nitride treatment and is then subjected to the oxidation treatment; and forming a P-type GaN layer in the gate recess and on the single-layered surface modification layer, wherein the single-layered surface modification layer is in direct contact with a bottom surface of the P-type GaN layer.

2. The method according to claim 1, wherein the amorphous silicon layer has a thickness of equal to or less than 10 angstroms.

3. The method according to claim 1, wherein the gate recess does not penetrate through the electron supply layer.

4. The method according to claim 1, wherein the dielectric passivation layer comprises oxide or aluminum nitride.

5. The method according to claim 1, wherein the dielectric passivation layer is thicker than the single-layered surface modification layer.

6. The method according to claim 1, wherein the dielectric passivation layer has a thickness of about 20 nanometers.

7. The method according to claim 1, wherein before forming the channel layer on the substrate, the method further comprises:

forming a buffer layer on the substrate.

8. The method according to claim 7, wherein the buffer layer comprises AlN or AlGaN.

9. The method according to claim 1, wherein the substrate is a silicon substrate.

10. The method according to claim 1, wherein the channel layer comprises intrinsic GaN.

11. The method according to claim 10, wherein the electron supply layer comprises AlGaN.

12. The method according to claim 1, wherein after forming the P-type GaN layer in the gate recess, the method further comprises:

forming a gate electrode on the P-type GaN layer; and forming a source electrode in a source region and a drain electrode in a drain region.

* * * * *